US012376257B2

(12) United States Patent
He et al.

(10) Patent No.: US 12,376,257 B2
(45) Date of Patent: Jul. 29, 2025

(54) SYSTEM AND METHOD FOR A RADIO MODULE ON PREMISE OF A COOLING FAN

(71) Applicant: Dell Products, LP, Round Rock, TX (US)

(72) Inventors: Qinghong He, Austin, TX (US); Travis C. North, Cedar Park, TX (US); Pomin Shih, Beitou District (TW)

(73) Assignee: DELL PRODUCTS LP, Round Rock, TX (US)

( * ) Notice: Subject to any disclaimer, the term of this patent is extended or adjusted under 35 U.S.C. 154(b) by 383 days.

(21) Appl. No.: 17/579,125

(22) Filed: Jan. 19, 2022

(65) Prior Publication Data

US 2023/0232569 A1 Jul. 20, 2023

(51) Int. Cl.
*H05K 7/20* (2006.01)
*G06F 1/20* (2006.01)

(52) U.S. Cl.
CPC .......... *H05K 7/20136* (2013.01); *G06F 1/20* (2013.01); *H05K 7/20336* (2013.01); *H05K 7/2039* (2013.01)

(58) Field of Classification Search
CPC .......... H05K 7/20136; H05K 7/20336; H05K 7/2039; G06F 1/20; G06F 1/1698; G06F 1/203
See application file for complete search history.

(56) References Cited

U.S. PATENT DOCUMENTS

| | | | |
|---|---|---|---|
| 6,111,748 A | 8/2000 | Bhatia | |
| 6,472,781 B2 * | 10/2002 | Yamamoto | F04D 29/424 310/58 |
| 7,002,797 B1 | 2/2006 | Wittig | |
| 7,486,519 B2 * | 2/2009 | Loiler | G06F 1/20 361/720 |
| 10,429,908 B2 | 10/2019 | Delano | |
| 2003/0053296 A1 | 3/2003 | Tanaka | |
| 2004/0095725 A1 | 5/2004 | Tanaka | |
| 2006/0146495 A1 | 7/2006 | Tanaka | |
| 2008/0013285 A1 * | 1/2008 | Hung | H01L 23/4093 165/185 |
| 2008/0030948 A1 | 2/2008 | Tanaka | |
| 2008/0043436 A1 * | 2/2008 | Hung | H01L 23/427 257/E23.099 |
| 2012/0099278 A1 * | 4/2012 | Chen | F28D 15/0233 165/104.26 |
| 2015/0116928 A1 * | 4/2015 | Delano | H01L 23/467 361/679.47 |

(Continued)

FOREIGN PATENT DOCUMENTS

EP     3063600 B1    8/2020
WO  2014/056692 A1  4/2014

*Primary Examiner* — Stephen S Sul
(74) *Attorney, Agent, or Firm* — Prol Intellectual Property Law, PLLC; H. Kennethl Prol

(57) ABSTRACT

An information handling system with a cooling system may include a processor, a memory; a power management unit (PMU) operatively coupled to the processor; a cooling fan operatively coupled to the processor to draw air into and direct air out of a base chassis of the information handling system, the cooling fan including a fan housing; and a radio module operatively coupled to the fan housing to be cooled by conduction to the fan housing and operation of the fan via convective cooling.

20 Claims, 7 Drawing Sheets

(56) References Cited

U.S. PATENT DOCUMENTS

| | | | |
|---|---|---|---|
| 2015/0342023 A1* | 11/2015 | Refai-Ahmed | H05K 7/20154 |
| | | | 29/829 |
| 2016/0248893 A1* | 8/2016 | Kim | H04M 1/026 |
| 2020/0081505 A1* | 3/2020 | Ma | G06F 1/203 |
| 2020/0396871 A1* | 12/2020 | Yun | H05K 7/2099 |
| 2021/0216119 A1* | 7/2021 | Kuo | G06F 1/203 |
| 2021/0288392 A1* | 9/2021 | Xin | H01Q 1/48 |
| 2022/0069437 A1* | 3/2022 | Yoo | H01Q 1/2266 |
| 2022/0174841 A1* | 6/2022 | Kitamura | G06F 1/1662 |
| 2022/0281317 A1* | 9/2022 | Ahn | B60K 35/235 |
| 2023/0132431 A1* | 5/2023 | Kwak | G06F 1/203 |
| | | | 320/109 |
| 2023/0200014 A1* | 6/2023 | Wang | H05K 7/20336 |
| | | | 361/700 |

* cited by examiner

SYSTEM AND METHOD FOR A RADIO MODULE ON PREMISE OF A COOLING FAN

FIELD OF THE DISCLOSURE

The present disclosure generally relates to a cooling system of an information handling system. The present disclosure more specifically relates to a system and method to cool a radio module of the information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a radio module (e.g., 5G radio module) used to communicate with a wireless network and remote and edge compute servers.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
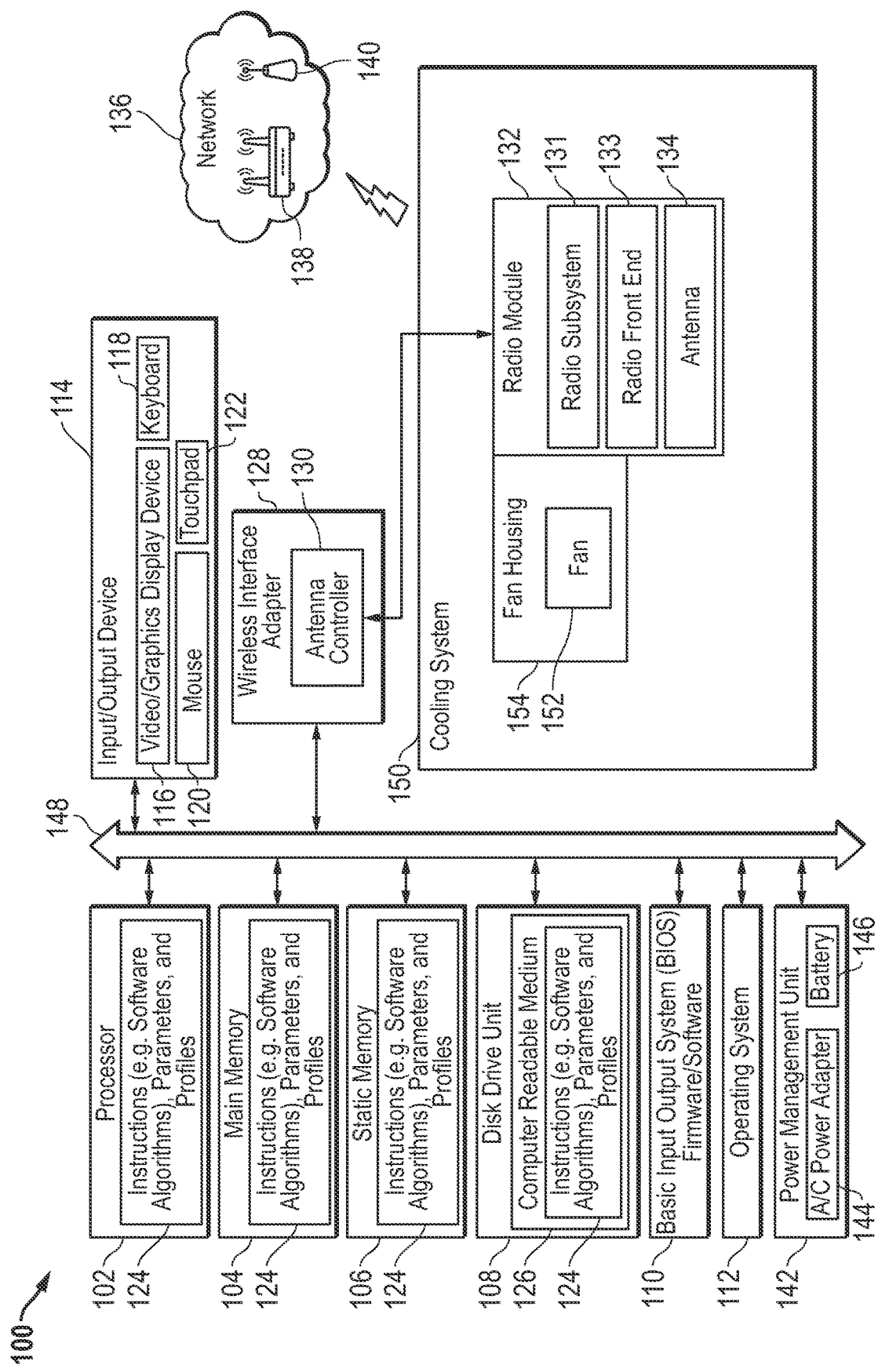
FIG. 1 is a block diagram illustrating an information handling system with a radio module within cooling fan according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include one or more antennas used to operatively couple the information handling system to a wireless network. These information handling systems may be made mobile so that a user may travel with an information handling system from location to location and still access a wireless network. The antennas may be used to operatively couple the information handling system to a wireless network that using, for example, 5G standards to do so. Other standards may be used and the present specification contemplates those uses. With the use of edge computing, (cloud computing or containers, to provide compute offload) the amount of data transmitted to and from the information handling system may be relatively higher. As such 5G, sub-6 GHz, and mmWave frequencies may be used to facilitate this increased level of data throughput. As a result, power consumption at the radio module (e.g., antenna radio and associated circuitry) may peak at, for example, 13 Watts with an average power consumption of 6.2 Watts. After some time, this level of power consumption may create a cooling and control challenge similar to that at a central processing unit (CPU) (e.g., a processor). This heat, if not expelled from within the information handling system, may cause damage to the radio module and other components. Additionally, the heat may heat a portion of the chassis of the information handling system such that it could cause injury or discomfort to a user when touched. Indeed, with an average power consumption of 6.2 Watts, the temperature of the chassis may be driven up as high as 140° F. (60° C.).

The present specification describes an information handling system that includes a processor and a memory and a power management unit operatively coupled to the processor. The information handling system also includes a cooling system or systems that cool a processor or other processing device as well as, in embodiments presented herein, a radio module. In an embodiment, this cooling system may include a cooling fan operatively coupled to the processor to direct air into and out of a chassis of the information handling system. In an embodiment, the cooling fan includes a fan housing that causes the airflow drawn into the cooling fan to be direct out of an airflow exit formed in a wall of the fan housing. The information handling system also includes a radio module thermally coupled to the fan housing or housed within the fan housing to be cooled by operation of the fan via convective cooling.

In an embodiment, the fan housing or portions of the fan housing can be used to cool the radio module via conductive cooling as well. In an embodiment, the radio module is placed within a portion of the fan housing along with the fan. The radio module may be allowed to abut an interior surface of a wall or a plurality of walls such that heat produced via operation of the radio module may be directed away from the radio module using conductive cooling. In this example, the fan housing may be made of a metal or other heat conductive material that receives the heat from the radio module and dissipates it throughout the rest of the fan housing. During operation of the cooling fan, therefore, this heat on the fan housing may be also dissipated through convective cooling as the fan spins and air flows into and through the fan housing. Additional cooling devices may also be operatively coupled to the fan housing to conduct heat away from the fan housing and, through convective cooling, be cooled themselves. These additional cooling devices may include an array of fins and a heat pipe associated with the cooling systems of the processor or other processing device. As each of these surfaces conduct heat, the fan may cool them via convective cooling form airflows. The information handling system may also include a vent formed on a surface of a chassis to allow the cooling fan to blow the hot air out of and away from the information handling system.

In another embodiment, the fan housing may have a height that is greater than the height of the radio module. This may allow the radio module to be cooled via both conductive cooling and convective cooling. In this embodiment, the operative contact of any portion of the radio module to an interior surface of a wall of the fan housing may conduct heat from the radio module via conductive cooling. Additionally, with a gap formed between another surface of the fan housing and the radio module, the radio module may be cooled via convective cooling via airflows in some embodiments as well providing a concurrent method of cooling the radio module.

In an embodiment, the fan housing of the cooling fan may include a fan housing extension extending away from the housing and made to be in operative contact with the radio module. In this example embodiment, the fan housing extension may conduct heat away from the radio module and into the surfaces of the fan housing via conductive cooling. As these surfaces of the fan housing heat up, the cooling fan may operate to cool those surfaces via convective cooling as well.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory 104, 106, or 108 (volatile (e.g., random-access memory, etc.), nonvolatile (read-only memory, flash memory etc.) or any combination thereof), one or more processing resources 102, such as a central processing unit (CPU), a graphics processing unit (GPU), hardware or software control logic, or any combination thereof. Additional components of the information handling system 100 may include one or more memory storage devices 106 or 108, one or more communications ports for communicating with external devices, as well as various input and output (I/O) devices 114, such as a keyboard 118, the touchpad 122, a mouse 120, a headset, a stylus, a video/graphics display device 116, or any combination thereof. Portions of an information handling system 100 may themselves be considered information handling systems 100.

Information handling system 100 may include devices or modules that embody one or more of the devices or execute instructions for the one or more systems and modules described herein, and operates to perform one or more of the methods. The information handling system 100 may execute instructions (e.g., software algorithms), parameters, and profiles 124 that may operate on servers or systems, remote data centers, or on-box in individual client information handling systems according to various embodiments herein. In some embodiments, it is understood any or all portions of instructions (e.g., software algorithms), parameters, and profiles 124 may operate on a plurality of information handling systems 100.

The information handling system 100 may include a processor 102 such as a CPU or GPU, control logic or some combination of the same. Any of the processing resources may operate to execute code that is either firmware or software code. Moreover, the information handling system 100 may include memory such as main memory 104, static memory 106, or other memory of computer readable medium 126 storing instructions (e.g., software algorithms), parameters, and profiles 124 executable by the antenna controller 130, embedded controller, or any other processing device (e.g., processor 102), and disk drive unit 108 (volatile (e.g., random-access memory, etc.), nonvolatile memory (read-only memory, flash memory etc.) or any combination thereof. The information handling system 100 may also include one or more buses 148 operable to transmit communications between the various hardware components such as any combination of various I/O devices 114 as well as between processors 102, the embedded controller, the operating system (OS) 112, the basic input/output system (BIOS) 110, the wireless interface adapter 128 the radio module 132, and the power management unit (PMU) 142, among other components described herein.

The information handling system 100 may further include a video/graphics display device 116. The video/graphics display device 116 in an embodiment may function as a liquid crystal display (LCD), an organic light emitting diode (OLED), a flat panel display, or a solid-state display. Additionally, the information handling system 100 may include an I/O device 114 that allows the user to interface with the information handling system 100 via the video/graphics display device 116, such as a cursor control device (e.g., the mouse 120, touchpad 122, or gesture or touch screen input), and the keyboard 118 or stylus, among others. Various drivers and control electronics may be operatively coupled to operate the I/O device 114 according to the embodiments described herein.

The network interface device in FIG. 1 is shown as wireless interface adapter 128 but may also be a wired network interface device as is understood in the art and may provide connectivity to a network 136, e.g., a wide area network (WAN), a local area network (LAN), wireless local area network (WLAN), a wireless personal area network (WPAN), a wireless wide area network (WWAN), or other network. The network interface device shown as wireless interface adapter 128 may provide connectivity to a network 136 via operation of a radio module 132 with control by an antenna controller 130. In an embodiment, the radio module 132 may be operatively coupled to the antenna controller 130 and may be part of wireless interface device 128 but may form a different physical device in some embodiments. In FIG. 1, radio module 132 is part of a wireless interface adapter 128, but is shown adjacent to or within a fan housing 154 according to embodiments herein. It is appreciated that any number of radios 131 and RF front ends 133 may be associated with the radio module 132 and may also be associated with a plurality of antennas 134 within the information handling system 100 and may operate under any wireless protocol described herein. In an embodiment, a radio module 132 operatively coupled to the fan housing 154 may include an antenna 134 as well as a radio 131 and front end 133. In the shown embodiment, the radio module 132 coupled to the fan housing 154 may include an antenna 134 with the radio 131 and front end 133 operatively coupled to or housed within the antenna 134. In an example embodiment, the radio module 132 may be a 5G mm Wave radio module 132. In an example embodiment, the radio module 132 may be a long-term evolution (LTE) protocol radio module 132 or any other type of radio module. In the embodiments described herein, the radio module 132 may further include a processing device that, during operation, creates an amount of heat. This heat is created when the processing device of the radio module 132 is transmitting, receiving data, processing that data, or converting that digital data received from the processor 102 into radio frequency (RF) signals used to transmit that data wirelessly via the antenna(s) 134 associated with the radio module 132. It is this heat created during operation of the radio module 132 that the cooling fan 150 with the fan housing 154 and fan 153 (among other devices) described herein are used to dissipate an amount of heat away from the radio module 132 as described herein.

Connectivity to a network 136 may be via wired or wireless connection. As shown, the wireless interface adapter 128 may operate in accordance with any wireless data communication standards. To communicate with a wireless local area network, standards including IEEE 802.11 a/h/j/n/ac/ax WLAN standards, IEEE 802.15 WPAN standards, WWAN such as 3GPP or 3GPP2, or similar wireless standards may be used. In some aspects of the present disclosure, one wireless interface adapter 128 may operate two or more wireless links. Information handling systems 100 including those that are mobile in embodiments of the present disclosure may employ a plurality of antenna systems for communication via wireless links operating on a variety of radio access technologies (RAT). For example, a mobile information handling system in an embodiment of the present disclosure may employ separate antenna systems for Wi-Fi signals, wireless wide area network (WWAN) signals, Bluetooth signals, and wireless local area network (WLAN) signals. WWAN signals in embodiments of the present disclosure may include 2G standards such as GSM, 2.5G standards such as GSM EDGE and GPRS, 3G standards such as W-CDMA/UMTS and CDMA 2000, 4G standards such as LTE, LTE-A, LTE-LAA, emerging 5G standards, or WiMAX, small cell WWAN, and the like. Wi-Fi and WLAN signals in embodiments of the present disclosure may include wireless links adhering to standards such as, for example, IEEE 802.11 WiFi, IEEE 802.11ad WiGig, IEEE 802.15 WPAN, and IEEE 802.11ax-2021 (e.g., WiFi 6 and 6E, 6 GHz technologies). In other aspects, several antenna systems may be available for each RAT to enable aggregated data communications such as via plural multiple in, multiple out (MIMO) streams (e.g., Wi-Fi MIMO or cellular MIMO) to enhance data bandwidth or reliability. In some examples, an information handling system 100 may support multi-RAT radios (4G, 5G, WLAN) that require simultaneous transmission using multiple antennas to support various modes of transmission (e.g., uplink (UL) MIMO and 5G E-UTRAN new radio (EN-DC)). With 5G technology, these information handling systems may use, in an example embodiment, sub-6 GHZ antennas and mmWave antennas as well as WLAN antennas, resulting in several antennas in the information handling system. The wireless interface controller 128 may cause the radio module 132 to wirelessly communicate with an access point 138 or base station 140 within a network 136.

Wireless interface adapter 120 may connect to any combination of macro-cellular wireless connections including 2G, 2.5G, 3G, 4G, 5G or the like from one or more service providers or privately administered network providers. The wireless interface adapter 128 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 136 may communicate voice, video or data over the network 136. Further, the instructions 124 may be transmitted or received over the network 136 via the network interface device or wireless interface adapter 128.

The information handling system 100 may include a set of instructions 124 that may be executed to cause the computer system to perform any one or more of the methods or computer-based functions disclosed herein. For example, instructions 124 may be executed by an antenna controller 130 and radio module 132, and may include software agents, or other aspects or components used to execute the methods and systems described herein. Various software modules comprising application instructions 124 may be coordinated by an operating system (OS) 112, and/or via an application programming interface (API). An example OS 112 may include Windows®, Android®, and other OS types. Example APIs may include Win 32, Core Java API, or Android APIs. Additionally, execution of the instructions described herein may be via execution of firmware by the antenna controller 130.

The disk drive unit 108 may include a computer-readable medium 126 in which one or more sets of instructions 124 such as software may be embedded and executed by the antenna controller 130, processor 102, and/or embedded controller, in an embodiment. Similarly, main memory 104 and static memory 106 may also contain a computer-readable medium for storage of one or more sets of instructions, parameters, or profiles 124. The disk drive unit 108 and static memory 106 may also contain space for data storage. Further, the instructions 124 may embody one or more of the methods or logic as described herein. For example, instructions relating to and executed by the antenna controller 130, embedded controller, processor 102, software algorithms, processes, and/or methods may be stored here. In a particular embodiment, the instructions, parameters, and profiles 124 may reside completely, or at least partially, within the main memory 104, the static memory 106, and/or within the disk drive 108 during execution by the processor 102 of information handling system 100. As explained, some or all of the instructions 124 to be executed by a processor 102 for software applications may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable instructions 124 to be executed by the antenna controller 130, processor 102, or embedded controller may be stored in static memory 106, or the disk drive unit 108 on a computer-readable medium 126 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

As described herein, the information handling system 100 may further include a power management unit (PMU) 142 (a.k.a. a power supply unit (PSU)). The PMU 142 may manage the power provided to the components of the information handling system 100 such as the processor 102, components of a cooling system such as a fan, one or more disk drive units 108, a graphical processing unit (GPU), a video/graphic display device 116 or other I/O device 114 such as the stylus, and other components that may require power when a power button has been actuated by a user. In an embodiment, the PMU 142 may monitor power levels and be electrically coupled to the information handling system 100 to provide this power and coupled to bus 148 to provide or receive data or instructions. The PMU 142 may regulate power from a power source such as a battery 146 or A/C power adapter 144. In an embodiment, the battery 146 may be charged via the A/C power adapter 144 and provide power to the components of the information handling system 100 via wired connections as applicable, or when A/C power from the A/C power adapter 144 is removed.

As described herein, the information handling system 100 includes a cooling fan 150. The cooling fan may be used to cool devices housed within a chassis of the information handling system 100. The cooling fan 150, in an example embodiment, may be operatively coupled to a heat pipe or other cooling device that draws heat away from a processor 102 or other processing device power adapter 144, battery 146, or other heat generating component via conductive cooling and, via convective cooling by the cooling fan 150, cools the heat pipe by passing air over the heat pipe and expel that now-heated air out of the chassis of the information handling system 100 via a vent formed on a wall of that chassis. The cooling fan 150 may include a fan 152 housed within a fan housing 154. In an embodiment, the interior volumetric area of the fan housing 154 as well as the shape of the fan housing 154 may cause a flow of air in an inlet vent and out of the fan housing 154 as the fan 152 spins within the fan housing 154. In an embodiment, a wall or a plurality of walls may be made of a metal or other heat conductive material. In an embodiment, the heat pipes may be operatively coupled to the fan housing 154 (e.g., in physical contact with) so that heat at the walls of the fan housing 154 may be conducted into the heat pipe via conductive cooling wherein the heat pipes or fan housing 154 are cooled by operation of the cooling fan 150 via convective cooling.

In an example embodiment, the cooling fan 150 may be operatively coupled to an array of fins. The array of fins may, like the heat pipe, be operatively coupled to the fan housing 154 (e.g., in physical contact with the fan housing 154) so that heat at the walls of the fan housing 154 may be conducted into the array of fins. This allows the array of fins to also be cooled by operation of the cooling fan 150 via convective cooling. In an embodiment, the array of fins may be separated by a distance so that the airflow from the operation of the cooling fan 150 may pass through cooling the array of fins for convective cooling. The now-heated air, after passing through the array of fins, may be expelled out of the chassis of the information handling system 100 via the vent formed in the wall of the chassis.

As described herein, the information handling system 100 also includes a radio module 132. The radio module may be, in an example embodiment, a 5G radio module that creates a relatively high amount of heat during operation. This heat, if not expelled from within the information handling system 100, may cause damage to the radio module and other components. Additionally, the heat may heat a portion of the chassis of the information handling system such that it could cause injury or discomfort to a user when touched. Indeed, with an average power consumption of 6.2 Watts, the temperature of the chassis of the information handling system 100 may be driven up as high as 140° F. (60° C.) via operation of the radio module 132. Because of these high temperatures created by the radio module 132 during operation, a cooling system may be used to keep that radio module 132 cool as well. According to an example embodiment described herein, the radio module 132 is operatively coupled to or housed within the fan housing 154 of the cooling fan 150 to cool the radio module 132 via conductive cooling, via convective cooling, or a combination of conductive cooling and convective cooling.

In an embodiment, the radio module 132 may be placed within the fan housing 154. In this embodiment, the radio module 132 may be operatively coupled to the processor 102, external antenna controller 130, or other external wireless interface adapter 128 components, if any, via a connector that passes through a hole formed in a wall of the fan housing 154. The radio module 132 may also be operatively coupled to power (e.g., to the PMU 142) via a similar or the same hole formed in the wall of the fan housing 154. In an embodiment, the radio module 132 may also be operatively coupled to an antenna 134 or antenna array placed outside of the fan housing 154 so that data may be transceived at that antenna 134 or antenna array. In example embodiments, the radio module 132 may include, a radio frequency (RF) radio 131, a front end 133, and a processing device used to process data received from the processor and convert that data into a data stream for communication with a wireless network.

In an embodiment, the fan housing 154 may be expanded to house both the fan 152 and the radio module 132 within the fan housing 154. In an embodiment, the radio module 132 within the fan housing 154 may be placed such that the airflow produced by the operation of the fan 152 causes the air to flow out of the fan housing 154 via an airflow exit formed in a wall of the fan housing 154. As described herein, this airflow exit may open up to the array of fins or heat pipe as described in an example embodiment herein.

In the embodiment where the radio module 132 is placed within the fan housing 154, a first surface of the radio module 132 may be operatively coupled to an interior surface of a wall of the fan housing 154. This may be accomplished, in an example embodiment, by making the height of the fan housing 154 contact a top surface of the radio module 132. A thermal pad or heat conductive adherent may be used in some embodiments to facilitate contact and heat transfer to the fan housing 154. In an embodiment, the thermal pad or heat conductive adherent may be made of a thermally conductive material such as silicone, paraffin wax, and acrylic among others. In this embodiment, the operatively coupling of the first surface of the radio module 132 to the wall allows heat to be drawn away from the radio module 132 via conductive heating. Additionally, in an embodiment where not all surfaces of the radio module 132 are in physical contact with the interior surfaces of the fan housing 154 the radio module 132 may also be cooled via convective cooling. In this embodiment, the exposed surface may have an airflow passed across it via operation of the fan 152. As described herein, the fan housing 154, with the radio module 132 therein, may be formed so that an airflow may be passed across the radio module 132 within the fan housing 154 and out of the airflow exit.

In an embodiment the radio module 132 is placed within the fan housing 154, a plurality of surfaces of the radio module 132 may be operatively coupled to a plurality of internal walls of the fan housing 154. In this embodiment, the height of the fan housing 154 may be such that both a top side and a bottom side of the radio module 132, when placed within the fan housing 154, are operatively coupled (e.g., thermally coupled) to at least two interior sides of the walls of the fan housing 154 such as a top wall and a bottom wall. Again, heat produced by the operation of the radio module 132 (e.g., 5G radio module) may be drawn away from the radio module 132 and into the walls of the fan housing 154 via conductive cooling. This heat at the walls of the fan housing 154 may then be cooled via convective cooling via operation of the fan 152. During operation, in other embodiments as well, heat may be conducted away from the walls of the fan housing 154 and into the array of fins and heat pipe due to the fan housing 154 being operatively coupled to the array of fins or heat pipe in an example embodiment. As the heat is transferred to these devices, the operation of the fan 152 may also cause an airflow to pass across them and out of the chassis of the information handling system 100 via a vent formed in a wall of the chassis.

In another embodiment, the fan housing 154 may include a fan housing extension. The fan housing extension may be made of a heat conductive material that extends away from an outside surface of the fan housing to a location within the chassis of the information handling system 100 where the radio module 132 is placed. In this embodiment, the fan housing extension may thermally couple to a single surface of the radio module 132 or a plurality of surfaces of the radio module 132. The fan housing extension may extend from a base housing of the fan housing 154 or a cover of the fan housing 154. Further, the fan housing extension may be coupled to a surface of the radio module 132 via a thermal pad or conductive adhesive to assist thermal coupling in an embodiment. During operation of the radio module 132 and as heat is produced by the radio module 132, heat may be drawn away from the radio module 132 via the conductive cooling properties of the fan housing extension. As heat is conducted into the fan housing extension, the heat or some of the heat may be conducted into the fan housing 154. This heat may then be dissipated out of the chassis of the information handling system 100 via operation of the fan 152 via convective cooling.

Although the present specification describes a radio module 132 being placed within a fan housing 154 and/or operatively coupled to a fan housing extension, the present specification contemplates that any type of heat-producing device may be similarly situated. In some embodiments, a separate processing device apart from the processor 102 or even the processor 102 may be arranged to be operatively coupled to a fan housing extension and/or be placed within a portion of the fan housing in order to direct heat away from the processing device via conductive and/or convective cooling. Other devices such as a battery may also be an example heat-producing component within the chassis of the information handling system that may be placed within the fan housing 154 and/or in contact with a fan housing extension.

In an embodiment, the information handling system 100 may include one or more of an OS 112, and basic BIOS firmware/software 110 or application programs that may be executable instructions 124 executed at any processor 102 and stored at one or more memory devices 104, 106, or 180. BIOS firmware/software 110 functions to initialize the information handling system 100 on power up, to launch an OS 112, and to manage input and output interactions between the OS 112 and the other elements of information handling system 100 including the radio module 132 and antenna controller 130. In a particular embodiment, BIOS firmware/software 110 resides in memory 104, and include machine-executable code that is executed by processor 102 to perform various functions of information handling system 100 as described herein. In another embodiment (not illustrated), application programs and BIOS firmware/software 110 reside in another storage medium of the information handling system 100. For example, application programs and BIOS firmware/software 110 can reside in drive unit 108, in a ROM (not illustrated) associated with the information handling system 100, in an option-ROM (not illustrated) associated with various devices of the information handling system 100, in a storage system (not illustrated) associated with network channel of a wireless interface adapter 128, in another storage medium of the information handling system 100, or a combination thereof. Executable code instructions 124 for application programs and BIOS firmware/software 110 can each be implemented as single programs, or as separate programs carrying out the various features as described herein.

Figure 2:
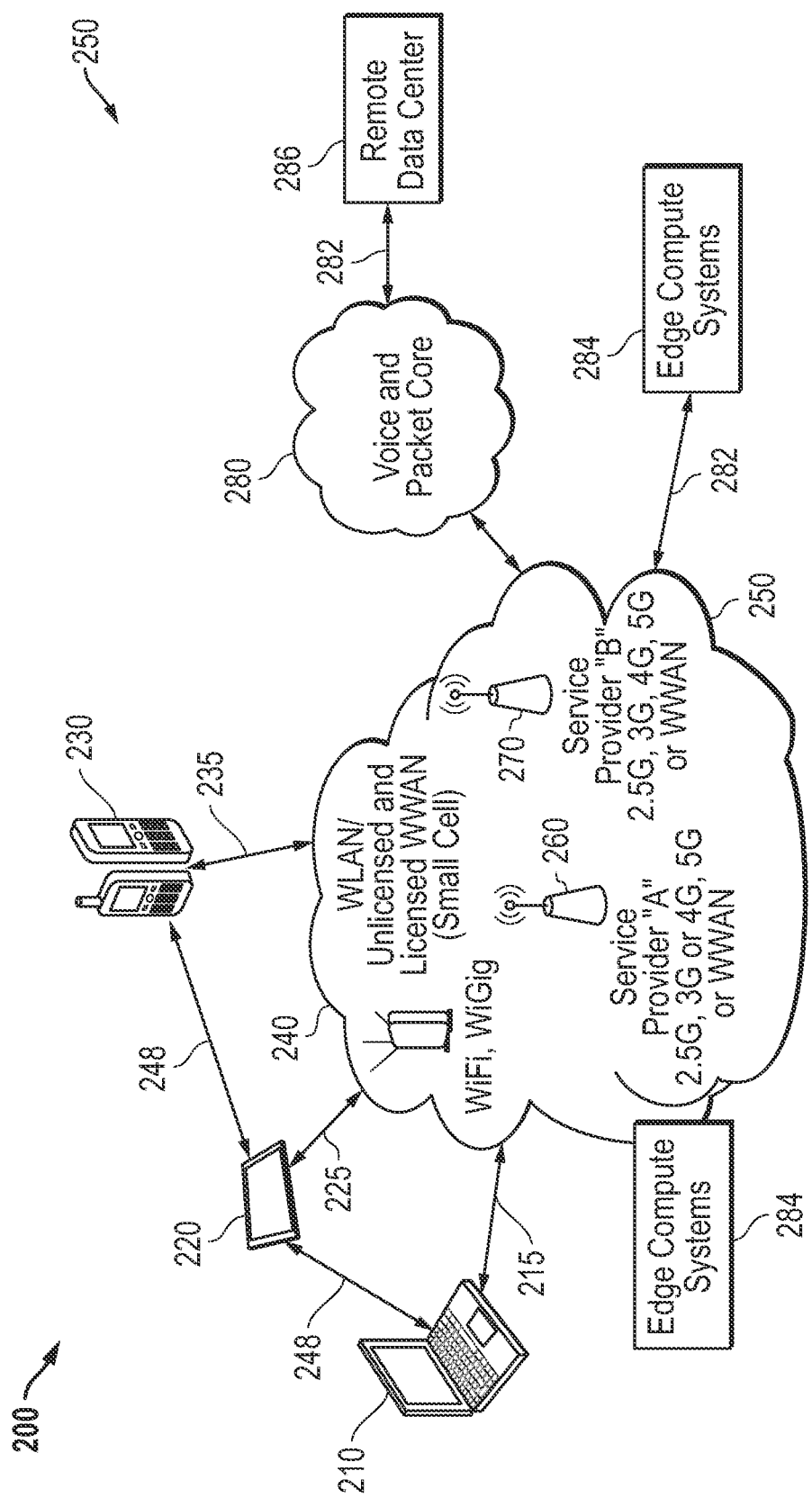
FIG. 2 is a block diagram of a network environment offering several communication protocol options and mobile information handling systems according to an embodiment of the present disclosure.

FIG. 2 illustrates a network 200 that can include one or more endpoint devices 210, 220, 230. The endpoint devices 210, 220, 230 shown in FIG. 2 may be similar to the information handling system 100 described in connection with FIG. 1. In a particular embodiment, network 200 includes networked mobile endpoint devices 210, 220, 230, wireless network access points, and multiple wireless connection link options. A variety of additional computing resources of network 200 may include client mobile information handling systems, data processing servers, network storage devices, local and wide area networks, a RAN service provider, or other resources as needed or desired. As partially depicted, endpoint devices 210, 220, 230 may be a laptop computer, tablet computer, 360-degree convertible systems, wearable computing devices, or a smart phone device. These mobile endpoint devices 210, 220, 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option. In an embodiment, these networks may provide cloud computing resources for the individual mobile endpoint devices 210, 220, 230.

Since WPAN or Wi-Fi Direct connection 248 and WWAN networks can functionally operate similar to WLANs, they may be considered as wireless local area networks (WLANs) for purposes herein. Components of a WLAN may be connected by wireline or Ethernet connections to a wider external network such as a voice and packet core 280. For example, wireless network access points or base stations may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11ax-2021, (e.g., Wi-Fi 6 and 6E, 6 GHz technologies), or 5G small cell WWAN communications such as gNodeB, eNodeB, or similar and future wireless network protocols and access points. Alternatively, other available wireless links within network 240 may include macro-cellular connections 250 via one or more service providers 260 and 270. Again, as described herein, the organization of a number of endpoint devices 210, 220, 230 may be defined by the endpoint devices 210, 220, 230 accessing a specific or number of specific base stations. As described herein, the endpoint devices 210, 220, 230 may be operatively coupled to any of the macro-cellular connections 250 via one or more service providers 260 and 270 or to the wireless local area networks (WLANs) selectively. Service provider macro-cellular connections may include 2G standards such as GSM, 2.5G standards such as GSM EDGE and GPRS, 3G standards such as W-CDMA/UMTS and CDMA 2000, 4G standards, or emerging 5G standards including WiMAX, LTE, and LTE Advanced, LTE-LAA, small cell WWAN, upcoming 3GPP protocols, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells. As described herein, utilization of RF communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac/ax (e.g., center frequencies between 5.170-7.125 GHZ). WLAN, for example, may operate at a 2.4 GHz band, 5 GHz band, and/or a 6 GHz band according to, for example, Wi-Fi, Wi-Fi 6, or Wi-Fi 6E standards. WWAN may operate in a number of bands, some of which are proprietary but may include a wireless communication frequency band. For example, low-band 5G may operate at frequencies similar to 4G standards at 600-850 MHz or, in an embodiment, 960 Mhz. Mid-band 5G may operate at frequencies in an FR1 range between 1.8 and 6 GHz. Additionally, high-band 5G frequencies may operate at 25 to 39 GHz and even higher. In additional examples, WWAN carrier licensed bands may operate at the new radio frequency range 1 (NRFR1), NRFR2, bands, and other known bands as described herein per the operation of the 5G protocol standards for a 5G radio module. Each of these frequencies used to communicate over the network 240 may be based on the radio access network (RAN) standards that implement, for example, eNodeB or gNodeB hardware connected to mobile phone networks (e.g., cellular networks) used to communicate with the endpoint devices 210, 220, 230. In the example embodiment, mobile endpoint devices 210, 220, 230 may also include both unlicensed wireless RF communication capabilities as well as licensed wireless RF communication capabilities. For example, licensed wireless RF communication capabilities may be available via a subscriber carrier wireless service operating the cellular networks. With the licensed wireless RF communication capability, an WWAN RF front end of the endpoint devices 210, 220, 230 may operate on a licensed WWAN wireless radio with authorization for subscriber access to a wireless service provider on a carrier licensed frequency band. WLAN such as Wi-Fi (e.g., Wi-Fi 6) may be unlicensed.

In some embodiments according to the present disclosure, a networked mobile endpoint device 210, 220, 230 may each have a plurality of wireless network interface systems or radio protocol subsystems capable of transmitting simultaneously within several communication bands or even utilizing a shared communication frequency band access multiple protocols. That communication within a shared communication frequency band may be sourced from different protocols on parallel wireless network interface systems or from a single wireless network interface system capable of transmitting and receiving from multiple protocols. Similarly, a single antenna or the plurality of antennas in each endpoint device 210, 220, 230 may be used on each of the wireless communication devices such as according to embodiments herein and may be suited to plural RF bands. As described herein, each of the endpoint devices 210, 220, 230 may include a 5G antennas that are capable of transmitting and receiving data using an FR1 and FR2 frequency concurrently to communicate with multiple networks. Example competing protocols may be local wireless network access protocols such as Wi-Fi/WLAN, WiGig, and small cell WWAN in an unlicensed, shared communication frequency band. Within local portion of wireless network 250 access points for Wi-Fi or WiGig as well as small cell WWAN connectivity may be available in 5G technology or emerging 6G technology. This may create situations where a plurality of antenna systems are operating on an endpoint device 210, 220, 230 via concurrent communication wireless links on both WLAN and WWAN radios and antenna systems. In some embodiments, concurrent wireless links may operate within the same, adjacent, or otherwise interfering communication frequency bands. The antenna may be a transmitting antenna that includes high-band, medium-band, low-band, and unlicensed band transmitting antennas in embodiments herein. The antenna may cooperate with other antennas in a N×N MIMO (where "N" is any number) array configuration according to the embodiments described herein. Alternatively, embodiments may include a single transceiving antennas capable of receiving and transmitting, and/or more than one transceiving antennas. Each of the antennas included in the endpoint devices 210, 220, 230 in an embodiment may be subject to the FCC regulations on specific absorption rate (SAR).

The voice and packet core network 280 shown in FIG. 2 may contain externally accessible computing resources such as containerize applications that may execute at edge compute resources 284 or connect to a remote data center 286. The voice and packet core network 280 may contain multiple intermediate web servers or other locations with accessible data (not shown). The voice and packet core network 280 may also connect to other wireless networks similar to 240 or 250 and additional mobile endpoint devices 210, 220, 230 or similar connected to those additional wireless networks. Connection 282 between the wireless network 240 and edge compute resources 284 or remote data center 286 or connection to other additional wireless networks may be via Ethernet or another similar connection to the worldwide-web, a WAN, a LAN, another WLAN, or other network structure. Such a connection 282 may be made via a WLAN access point/Ethernet switch to the external network and includes a backhaul connection. The access point may be connected to one or more wireless access points in the WLAN before connecting directly to a mobile information handling system or may connect directly to one or more mobile endpoint devices 210, 220, 230. Alternatively, mobile endpoint devices 210, 220, 230 may connect to the external network via base station locations at service providers such as 260 and 270. These service provider locations may be network connected via backhaul connectivity through the voice and packet core network 280.

Remote data centers 286 may include web servers or resources within a cloud environment that operate via the voice and packet core 280 or other wider internet connectivity. For example, remote data centers 286 can include additional information handling systems, data processing servers, network storage devices, local and wide area networks, or other resources as needed or desired. In an embodiment, the remote data center 286 may include one or more servers. In another embodiment, the on-demand network slice overlay optimization system 201 may be directly accessible by the endpoint devices 210, 220, 230 via the one or more networks.

Edge compute systems 284, in an embodiment, may be used to offload processing requirements for each of the mobile endpoint devices 210, 220, 230 described herein. In this embodiment, the edge compute systems 284 may be any computing system or distributed computing systems that places the processing and data storage resources within the network 240 and 250 closer to the mobile endpoint devices 210, 220, 230 to improve response times and save bandwidth while offloading processing of data from the mobile endpoint devices 210, 220, 230 to these edge compute systems 284. In an embodiment, containerized software applications may be executed on the edge compute systems 284 as a bundle of application code, configuration files, libraries, and dependencies used to execute those containerized software applications. During operation of the mobile endpoint devices 210, 220, 230, any applicable containerized software application may be accessed by the respective processing devices in the mobile endpoint devices 210, 220, 230.

Having such edge compute or remote capabilities may permit fewer resources to be maintained at the mobile endpoint devices 210, 220, 230 allowing streamlining and efficiency within those devices. Similarly, remote data center permits fewer resources to be maintained in other parts of network 200. Thus, high data bandwidth wireless links are desired for endpoint devices 210, 220, 230 to interface with greater and greater resources located on a network edge or as a remote data center. This requires more antennas, more power, and more heat, in less space within the endpoint devices 210, 220, 230.

Although network connections 215, 225, and 235 are shown connecting wireless adapters of mobile endpoint devices 210, 220, 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower and base stations such as that shown with service provider A 260 or service provider B 270 and in network 250. In other aspects, mobile endpoint devices 210, 220, 230 may communicate intra-device via intra-device connections 248 when one or more of the mobile endpoint devices 210, 220, 230 are set to act as an access point or even potentially an WWAN connection via small cell communication on licensed or unlicensed WWAN connections. For example, one of the endpoint devices 210, 220, 230 may serve as a Wi-Fi hotspot in an embodiment. Concurrent wireless links to the endpoint devices 210, 220, 230 may be connected via any access points including other mobile information handling systems as illustrated in FIG. 2.

Figure 3A:
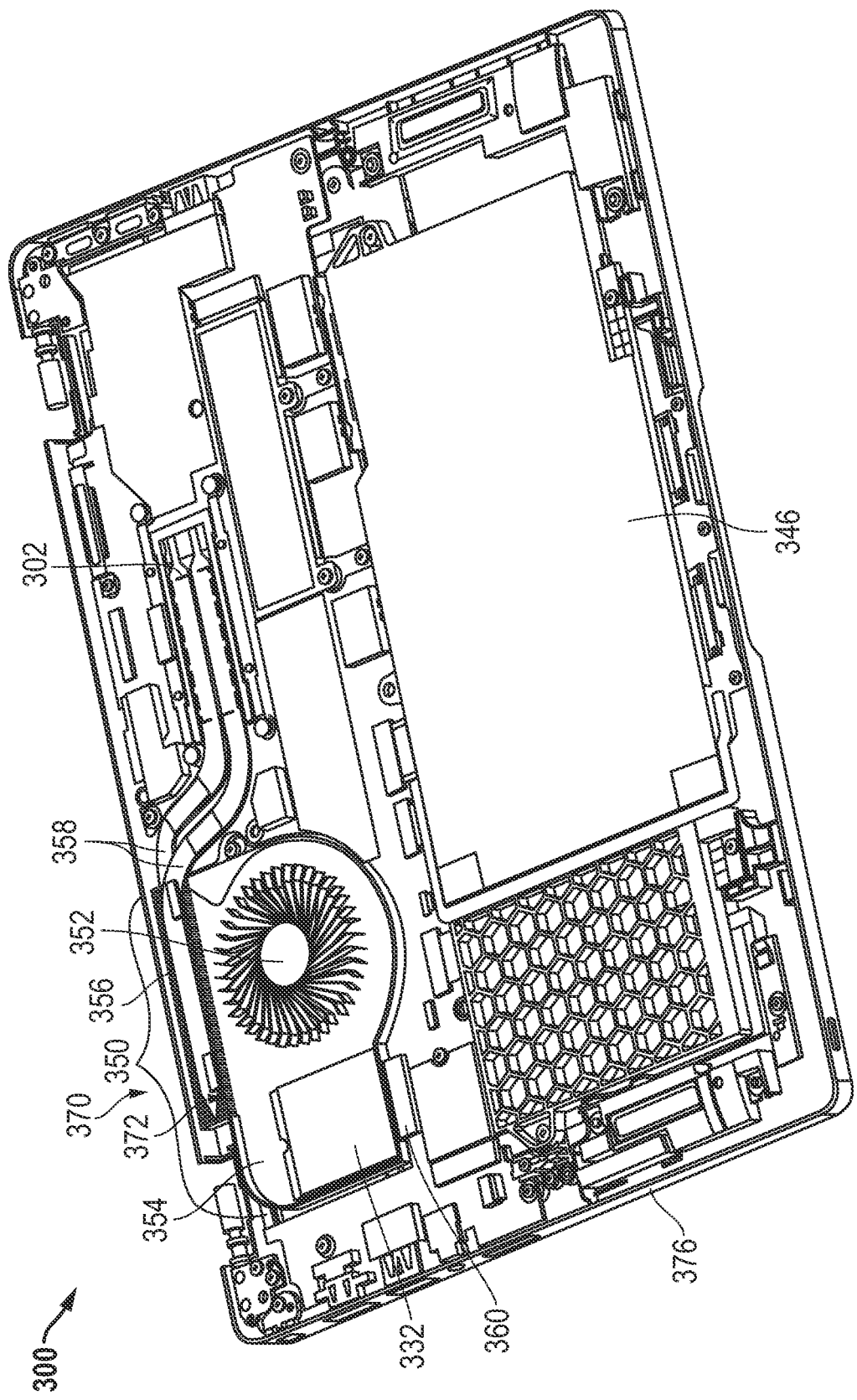
FIG. 3A is a graphic diagram of a cooling fan and fan housing placed in thermal communication with a 5G radio module and an existing cooling system within the information handling system according to an embodiment of the present disclosure.

FIG. 3A is a graphic diagram of a cooling fan 350 and fan housing 354 placed in thermal communication with a 5G radio module 332 and an existing cooling system within the information handling system 300 according to an embodiment of the present disclosure. As described herein, the information handling system 300 may include a chassis 376 into which the cooling fan 350, radio module 332, heat pipes 358, and array of fins 356, and other devices are operatively coupled. In example embodiments described herein, a form factor case of the information handling system 300 may include an "a-cover" which serves as a back cover for a display housing (not shown in FIG. 3A) and a "b-cover" which may serve as the bezel, if any, and a display screen of the information handling system 300 such as a laptop information handling system 300. In a further example, the laptop information handling system 300 case may include a "c-cover" housing a keyboard, touchpad, speaker grill, and any cover in which these components are set and a "d-cover" base housing 376 (as is shown in FIG. 3A) for the laptop information handling system 300. Within the c-cover and d-cover housing 376, the information handling system 300 may also include a battery 346, the cooling system including the cooling fan 350 described herein, the processor shown at location 302 (herein referred to as processor 302), one or more memory devices and other components of the information handling system 300 that includes the 5G radio module 332. It is this d-cover 376 into which the 5G radio module 332 may be secured within the information handling system 300.

As described herein, FIG. 3A shows an instance where the radio module 332 has been placed within a fan housing 354 of the cooling fan 350. In this embodiment, the radio module 332 shares the space within the fan housing 354 with the fan 352 of the cooling fan 350. The radio module 332 may be placed a distance away from the fan 352 so that the fan 352 can rotate in order to create an airflow within the fan housing 354. In an embodiment, the fan 352 may create an airflow within the fan housing 354 so that an airflow is passed out from an airflow exit 372.

The information handling system 300 shown in FIG. 3A also shows a processor location 302 (herein referred to as the processor 302) of a cooling system that includes one or more heat pipes 358 and an array of fins 356. The cooling fan 350, in an example embodiment, may be operatively coupled to one or more heat pipes 358 or other cooling device that draws heat away from the processor 302 which may be a CPU, GPU, or other processing device via conductive cooling. These heat pipes 358 may, via convective cooling, also be cooled by the cooling fan 350 which cools the heat pipe by passing air over the heat pipe and expelling that now-heated air out of the chassis of the information handling system 300 via a chassis vent 370 formed on a wall of that d-cover 376. In an embodiment, the heat pipes 358 may be operatively coupled to the fan housing 354 (e.g., in physical contact with) so that heat at the walls of the fan housing 354 may be conducted into the heat pipe via conductive cooling wherein the heat pipes are then cooled by operation of the cooling fan 350 via convective cooling. The array of fins 356 may, like the heat pipe 358, be operatively coupled to the fan housing 354 (e.g., in physical contact with the fan housing 354) so that heat at the walls of the fan housing 354 may be conducted into the array of fins 356. This allows the array of fins 356 to be cooled by operation of the cooling fan 350 via convective cooling. In an embodiment, the array of fins may be separated by a distance so that the airflow from the operation of the cooling fan 350 may pass through cooling the array of fins via convective cooling. The now-heated air, after passing through the array of fins 356, may be expelled out of the chassis of the information handling system 300 via the vent formed in the wall of the d-cover 376.

As described herein, the radio module 332 may be operatively coupled to an interior surface of a wall of the fan housing 354 such as a fan cover (not shown) or the fan housing base (which is shown). In the example embodiment shown in FIG. 3A, the radio module 332 is shown to be in physical contact with a bottom wall fan housing base of the fan housing 354. Whether the radio module 332 is in physical contact with a top wall of the fan housing 354 may depend on the height of the fan housing 354. Because FIG. 3A does not show the top wall fan cover of the fan housing 354 (e.g., in order to show the placement of the radio module 332 and fan 352), the top wall fan cover of the fan housing 354 may or may not come into thermal contact with the radio module 332 in various embodiments. However, because the bottom wall fan housing base of the fan housing 354 is coupled to the radio module 332, heat produced by the operation of the radio module 332 may be conductively dissipated into this bottom wall. In an example, the bottom wall (or any other wall) of the fan housing 354 may be made of a heat conductive material such as a metal. A thermal pad or heat conductive adherent may be used in some embodiments to facilitate contact and heat transfer to the fan housing 354 from the radio module 332. This conductive cooling allows that heat to travel into the bottom wall where the bottom wall may be cooled via operation of the fan 352 using convective cooling. Additionally, or alternatively, the array of fins 356 and/or heat pipes 358 may be operatively coupled to the bottom wall such that heat at the bottom wall is also conducted into the array of fins 356 and/or heat pipes 358. This heat at the array of fins 356 and/or heat pipes 358 may also be cooled via operation of the fan 352 using convective cooling. In this embodiment, the operation of the fan 352 causes an airflow to pass over and through the heat pipes 358 and array of fins 356, respectively, to accomplish this convective cooling.

Additionally, because one or more surfaces of the radio module 332 are not in thermal contact with a wall of the fan housing 354 such as a side surface of the radio module 332, those exposed sides of the radio module 332 may also be cooled via operation of the fan 352. In this embodiment, the operation of the fan 352 causes an airflow to pass over these exposed surfaces such that the radio module 332 is also cooled via convective cooling. This may be true regardless of whether the top wall fan cover of the fan housing 354 is thermally coupled to the top of the radio module 332 or not because at least one other surface of the radio module 332 may be exposed to this airflow produced by the fan 352 in an example embodiment. Other embodiments may include the radio module 332 that is thermally coupled to the top wall fan cover of the fan housing 354 (not shown) within the fan housing 354. A thermal pad or heat conductive adherent may be placed between the radio module 332 and top cover of the fan housing 354 and is used to facilitate contact and heat transfer to the fan housing 154. In this example embodiment, the airflow produced by operation of the fan may cool any of the walls of this fan housing 354 via convective cooling while the fan housing 354 cool the radio module 332 via conductive cooling.

In an embodiment, the radio module 332 may be placed within a sub-housing and placed within the fan housing. In this example embodiment, interior surfaces of the walls of the sub-housing may be thermally coupled to the one or more surfaces of the radio module 332. A thermal pad or heat conductive adherent may be used in some embodiments to facilitate contact and heat transfer from the surfaces of the radio module 332 to the walls of this sub-housing. During operation, in this embodiment, the heat produced by the radio module 332 may be passed into the walls of this sub-housing via conductive cooling. Because this sub-housing is placed within the fan housing 354, this sub-housing may be cooled via convective cooling (e.g., airflow produced by activation of the fan) and/or may be cooled via conductive cooling (e.g., sub-housing in thermal contact with one or more walls of the fan housing 354).

In an embodiment, the radio module 332 may have any number or type of radio module connectors 360. The radio module connector 360 may operatively couple the radio module 332 to a processor 302 and/or antenna controller that provides data to the radio module 332 for conversion of that digital data into analog signals for transmission, via an antenna, wirelessly, to a wireless network. To accommodate for this radio module connector 360, a hole or via may be formed into a wall of the fan housing 354 so that the radio module connector 360 may pass therethrough and be operatively coupled to the processor. In an embodiment, similar holes or vias may be formed through the fan housing 354 to allow leads to an antenna or antennas to pass therethrough in order to transmit the RF signals to the wireless network. Each hole or via formed into a wall of the fan housing 354 may be sized to fit the element extending therethrough such that airflow produced by the fan 352 is not disrupted or passes through these holes or vias. In an embodiment, the fan housing 354 may act as a shielding cover for electromagnetic (EM) isolation from other components within the housing of the information handling system 300. In this embodiment, therefor, the fan housing 354 serves a plurality of purposes such as providing a housing into which heat can be pulled away from the radio module 332 via conductive cooling, providing a location where the fan 352 may cool the radio module 332 via convective cooling, and acting as an EM shielding for the radio module 332.

In an embodiment, when a top wall fan cover of the fan housing 354 is installed, the top wall may include an airflow entrance. In FIG. 3A the top wall fan cover is shown coupled to the d-cover where this airflow entrance is formed below that top wall fan cover and an airflow entrance is formed through this d-cover to allow air to pass into the fan housing 354 during operation of the fan 352. An airflow entrance formed into the fan housing 354 as well may allow air to be drawn into the fan housing 354 by the fan 352. The direction of the airflow into the fan housing 354 may be roughly axial to the rotational axis of the fan 352 (aka: z-direction) while the airflow out of the airflow exit 372 may be generally lateral with the fan 352 (aka: the x-y plane).

The placement of the fan housing 354, the heat pipes 358, the array of fins 356, the chassis vent 370 and other components within the d-cover 376 may be chosen based on a number of factors including the placement of the radio module 332. In an embodiment, the placement of these components may be such that the radio module 332 is at a location where RF transmissions may be made without degradation to the RF signal produced by the radio module 332 and transceived at the associated antenna(s).

Figure 3B:
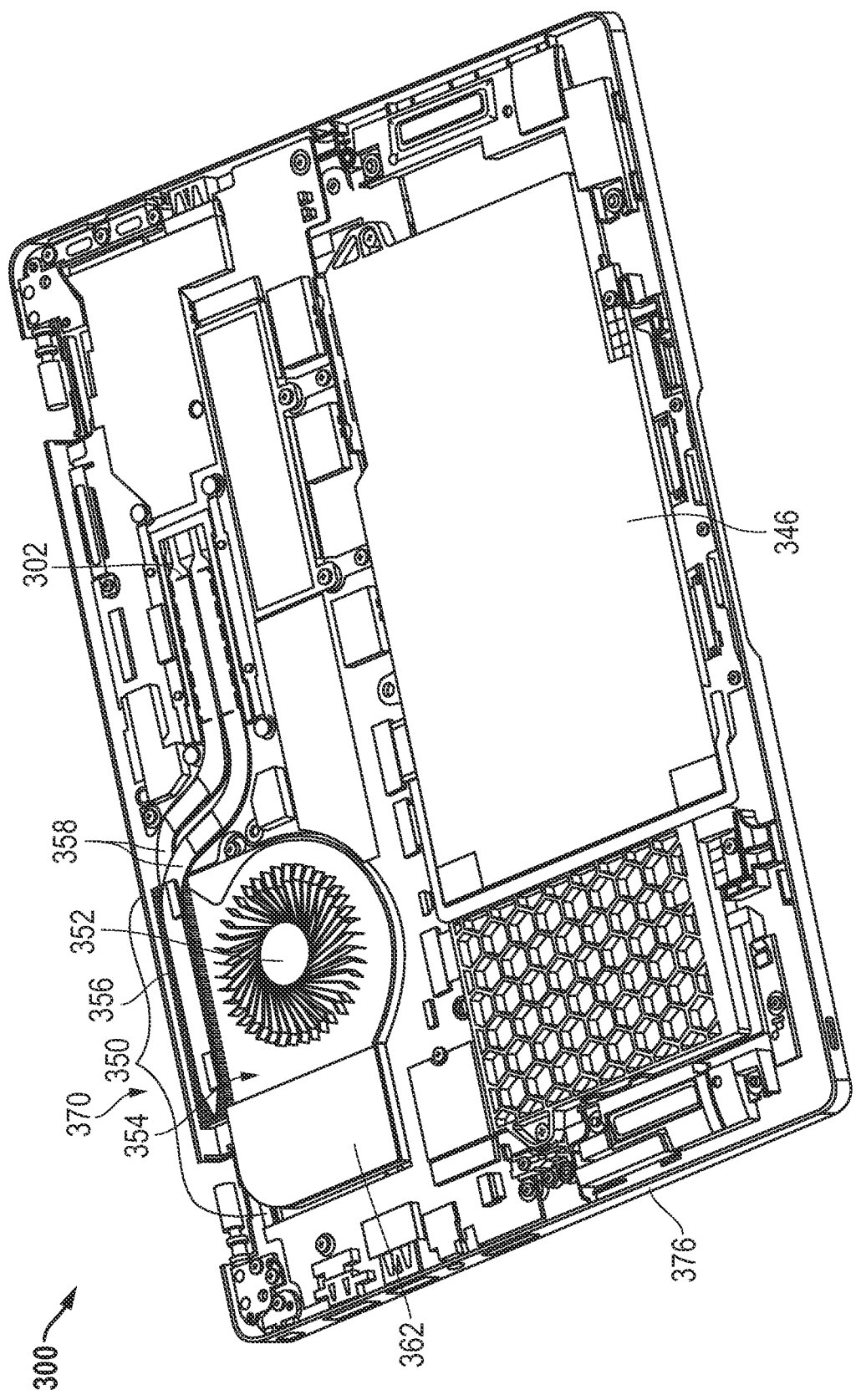
FIG. 3B is a graphic diagram of a cooling fan and fan housing with a block fan housing insert placed within the fan housing and an existing cooling system within the information handling system according to another embodiment of the present disclosure.

FIG. 3B is a graphic diagram of a cooling fan 350 and fan housing 354 with a block fan housing insert 362 placed within the fan housing 354 and an existing cooling system within the information handling system 300 according to another embodiment of the present disclosure. As described herein, the information handling system 300 may include a chassis into which the cooling fan 350, radio module 332, heat pipes 358, and array of fins 356, and other devices are operatively coupled. In example embodiments described herein, a form factor case of the information handling system 300 may include an a-cover (not shown), a b-cover (not shown), a "d-cover" 376, and a c-cover (not shown) as described in connection with FIG. 3B for the laptop information handling system 300.

In contrast to FIG. 3A, FIG. 3B shows the placement of a block fan housing insert 362 where a radio module 332 may otherwise had been placed. In an embodiment, a manufacturer may provide an online purchasing site where a purchaser may access in order to purchase an information handling system 300 such as those described herein. The manufacturer may also provide options to the potential purchasers as to what components are or are not included within the chassis of the information handling system 300. These may include the inclusion or exclusion of one or more types of static memory or disk drives, an additional keypad separate from a QWERTY-type keyboard, what types of storage devices, among others, as well as the number of and types of antenna systems to include within the chassis. As a result, a purchaser may or may not order an information handling system 100 that includes the radio module 332 such as a 5G radio module as an option within the fan housing 354 as described herein. Where a purchaser does not wish to include the radio module 132, the block fan housing insert 362 may be inserted into the fan housing 354 so that the airflow formed within the fan housing 354 by the fan 352 during operation does not create a vortex or stagnant airflow within the fan housing 354. Additionally, the block fan housing insert 362 may be removed later if and when the purchaser decides that the inclusion of the radio module 332 into the chassis of the information handling system 300 is necessary. This provides a flexible form factor where the operation of the fan 352 is optimized regardless of the inclusion of the radio module 332 within the fan housing 354 or not. Further, the inclusion of the block fan housing insert 362 when the radio module 332 is not present creates an optimal airflow out of the airflow exit 372 in order to connectionally cool the array of fins 356 and/or heat pipes 358 as described herein. Other components such as a processor (located at processor location 302 and referred here to as processor 302) under heat pipe 358 with fins 356 and chassis vent 370 of the information handling system cooling system as described herein are also shown in FIG. 3B. Although FIG. 3B shows a specific shape of the block fan housing insert 362, the present specification contemplates that any form factor of the block fan housing insert 362 may be used to optimize airflow out of the fan housing 354 when a radio module 332 is not present.

Figure 4A:
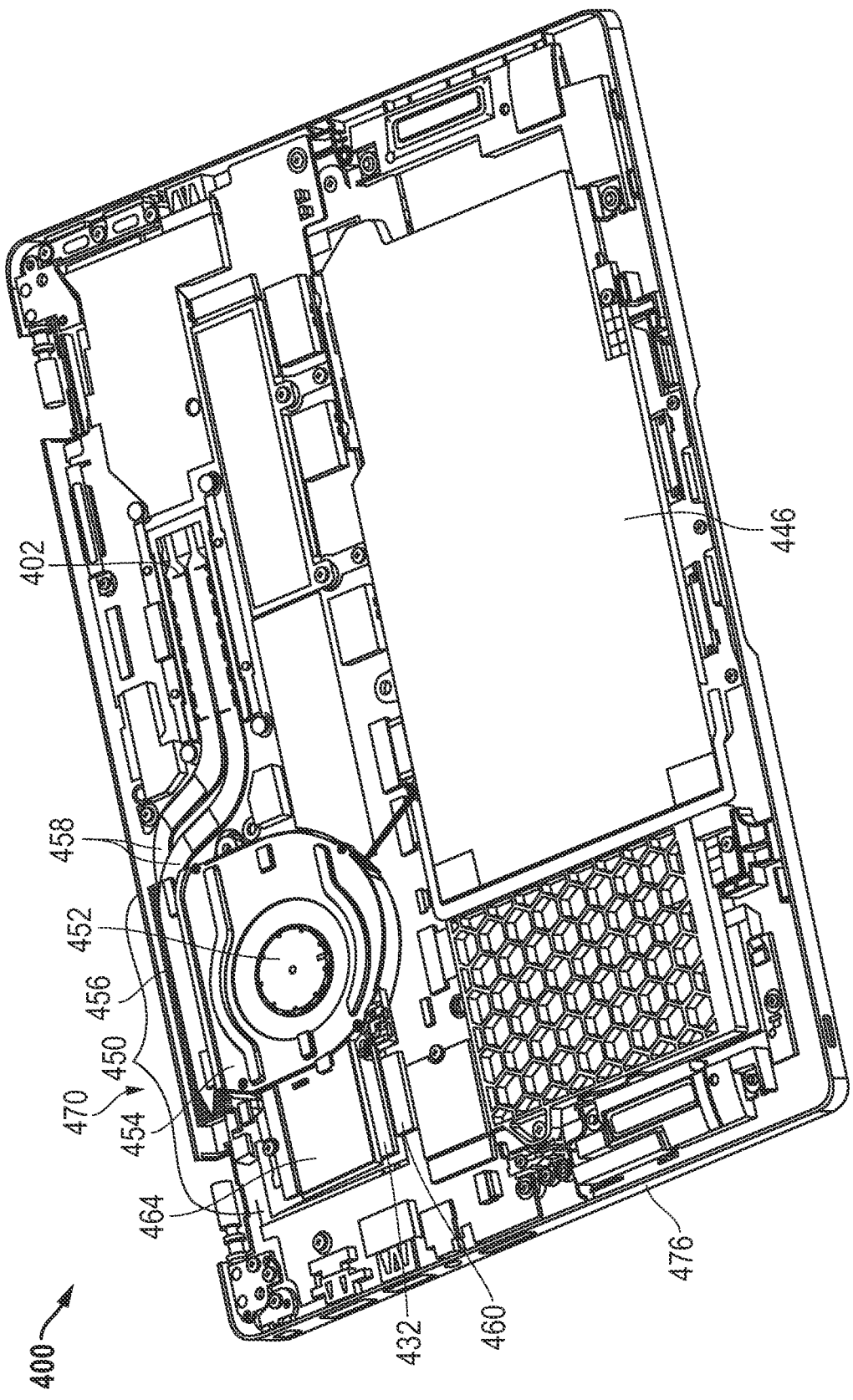
FIG. 4A is a graphic diagram of a cooling fan and fan housing with a fan housing extension placed in thermal communication with a 5G radio module and an existing cooling system within the information handling system according to an embodiment of the present disclosure.

FIG. 4A is a graphic diagram of a cooling fan 450 and fan housing 454 with a fan housing extension 464 placed in thermal communication with a 5G radio module 432 and an existing cooling system within the information handling system 400 according to an embodiment of the present disclosure. As described herein, the information handling system 400 may include a chassis d-cover 476 into which the cooling fan 450, radio module 432, heat pipes 458, and array of fins 456, and other devices are operatively coupled. In example embodiments described herein, a form factor case of the information handling system 400 may include an a-cover (not shown), a b-cover (not shown), a c-cover (not shown), and a d-cover 476 for the laptop information handling system 400 similar to that described in connection with FIG. 3A. Within the d-cover 476 housing, the information handling system 400 may also include a battery 446, the cooling system including the cooling fan 450 described herein, the processor shown at location 402 (herein referred to as processor 402), one or more memory devices and other components of the information handling system 400 that includes the 5G radio module 432. It is this d-cover 476 into which the 5G radio module 432 may be secured within the information handling system 400.

In the embodiment shown in FIG. 4A shows a fan housing extension 464. The fan housing extension 464 may be made of a heat conductive material that extends away from an outside surface of the fan housing 454 to a location within the chassis of the information handling system 400 where the radio module 432 is placed. In this embodiment, the fan housing extension 464 may contact a single surface of the radio module 432 or a plurality of surfaces of the radio module 432. A thermal pad or heat conductive adherent may be used in some embodiments to facilitate contact and heat transfer to the fan housing 154. During operation of the radio module 432 and as heat is produced by the radio module 432, heat may be drawn away from the radio module 432 via the conductive cooling properties of the fan housing extension 464. As heat is conducted into the fan housing extension 464, the heat or an amount of that heat may be conducted into the fan housing 454 via conductive cooling. This heat may then be dissipated out of the chassis of the information handling system 400 via operation of the fan 452 via convective cooling as the fan 452 cools the fan housing 454 during operation.

In an embodiment, the fan housing extension 464 may extend from a top wall fan cover (not shown) or from fan housing base of fan housing. In another embodiment, a plurality of fan housing extensions 464 may extend out from the fan housing 454 to be thermally coupled to a surface of the radio module 332. In these embodiments, a thermal pad or heat conductive adherent may be used to facilitate contact and heat transfer to the fan housing 454.

In an embodiment, the radio module 432 may have any number or type of radio module connectors 460. The radio module connector 460 may operatively couple the radio module 432 to a processor 402 and/or antenna controller that provides data to the radio module 432 for conversion of that digital data into analog signals for transmission, via an antenna, wirelessly, to a wireless network. In an embodiment, when a bottom wall fan housing base of the fan housing 454 is installed, the bottom wall may include an airflow entrance aligned with inlet vents in the chassis d-cover 476. This airflow entrance may allow air to be drawn into the fan housing 454 by the fan 452 (FIG. 4A shows an axis of the fan 452 with the blades covered by the fan housing 454). The direction of the airflow into the fan housing 454 may be roughly axial to the rotational axis of the fan 452 (aka: z-direction) from the bottom of d-cover 476 while the airflow out of the airflow exit 472 may be generally lateral with the fan 452 (aka: the x-y plane).

Figure 4B:
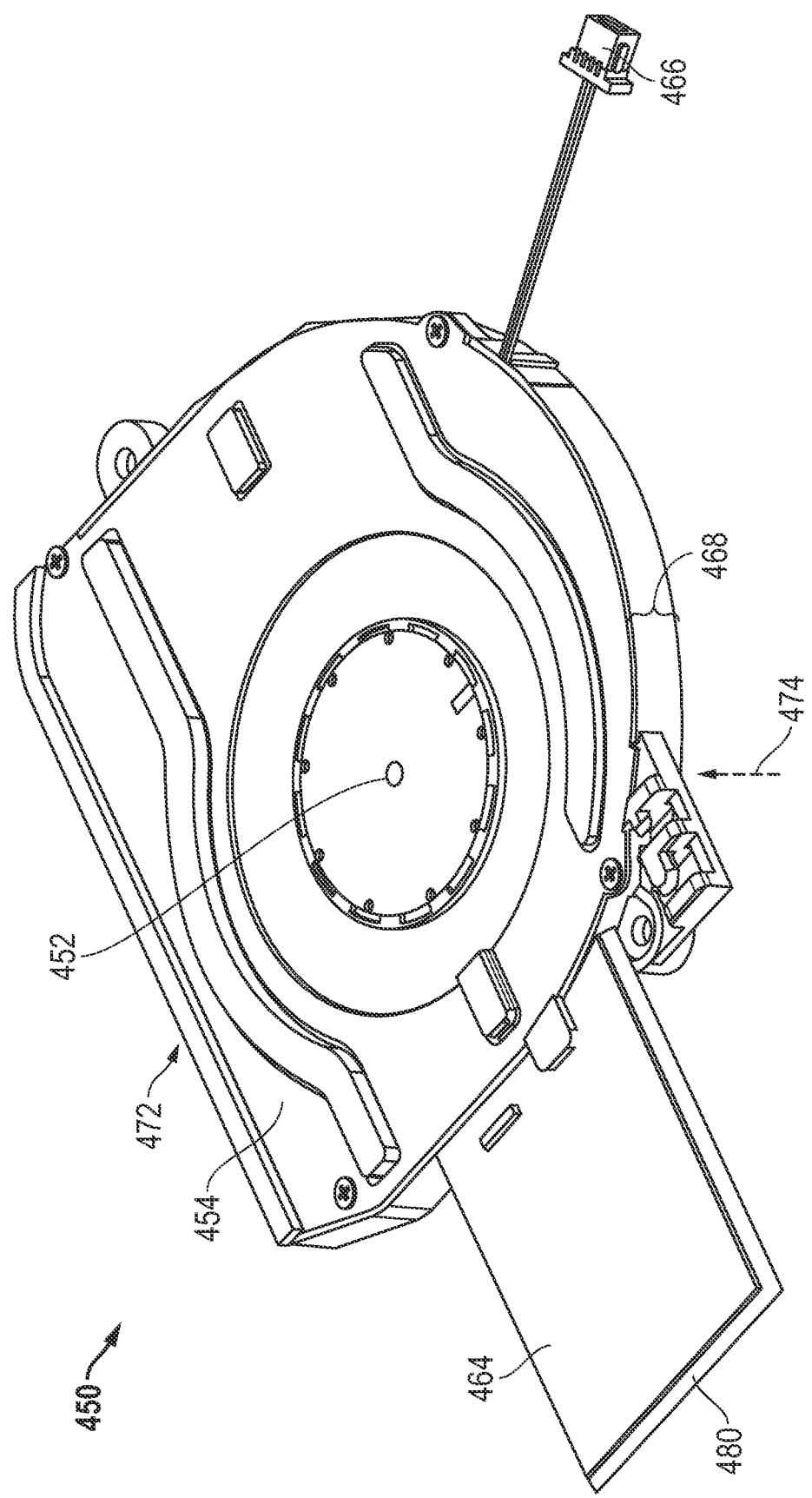
FIG. 4B is a graphic diagram of a cooling fan and fan housing with a fan housing extension according to another embodiment of the present disclosure.

FIG. 4B is a graphic diagram of the cooling fan 450 and fan housing 454 with a fan housing extension 464 according to another embodiment of the present disclosure. The fan housing 454 with its fan housing extension 464 is shown removed from within the chassis of the information handling system (e.g., 400, FIG. 4A). The fan housing 454 may have, in the embodiment shown, the fan housing extension 464 extending out from, and horizontal to, the fan housing 454 from a top wall fan cover of the fan housing 454 in an embodiment. In other embodiments, the fan housing extension 464 may extend from the base housing bottom portion of the fan housing 454.

The fan housing 454 further includes an airflow entrance 474 under fan housing 454 and hidden by fan housing 454 and an airflow exit 472 with which airflow may enter and exit the fan housing 454, respectively. In one embodiment, the height 468 of the fan housing 454 may be such that air may pass between an interior surface of the top wall fan cover of the fan housing 454 and the fan 452. The blades of the fan 452 (not shown due to the inclusion of the top wall of the fan housing 454; example embodiment shown in FIGS. 3A and 3B, fan 352) may draw the air into the fan housing 454 and create an airflow out of the airflow exit 472. As described herein, an array of fins and/or a heat pipe may be placed against the airflow exit 472 so that these components may be cooled via convective cooling. In an embodiment, the array of fins and/or the heat pipe may be operatively coupled to the fan housing 454 (e.g., thermally coupled) such that heat at the fan housing 454 may be cooled via conductive heating via the heat pipe and/or array of fins.

In an embodiment, the fan housing extension 464 may include a thermal pad or heat conductive adherent 480 may be used to facilitate contact and heat transfer to the fan housing 454. In an embodiment, the thermal pad or heat conductive adherent 480 may be made of a thermally conductive material such as silicone, paraffin wax, and acrylic among others.

The cooling fan 450 may also include a fan connector 466. The fan connector 466 may operatively couple a motor used to turn the fan 452 to a processing device or other computer circuitry. The processing device or other computer circuitry may direct if and when to operate the motor and its attached fan 452. The operation of the motor may be based on the processing device or other computer circuitry detecting heat fluctuations via, for example, one or more temperature sensors. These temperature sensors may be located, for example, at the processing device, at the 5G radio module (e.g., 432, FIG. 4A), at the fan housing 454 or any other location where operation of the fan 452 may reduce an amount of heat via convection cooling.

Figure 5:
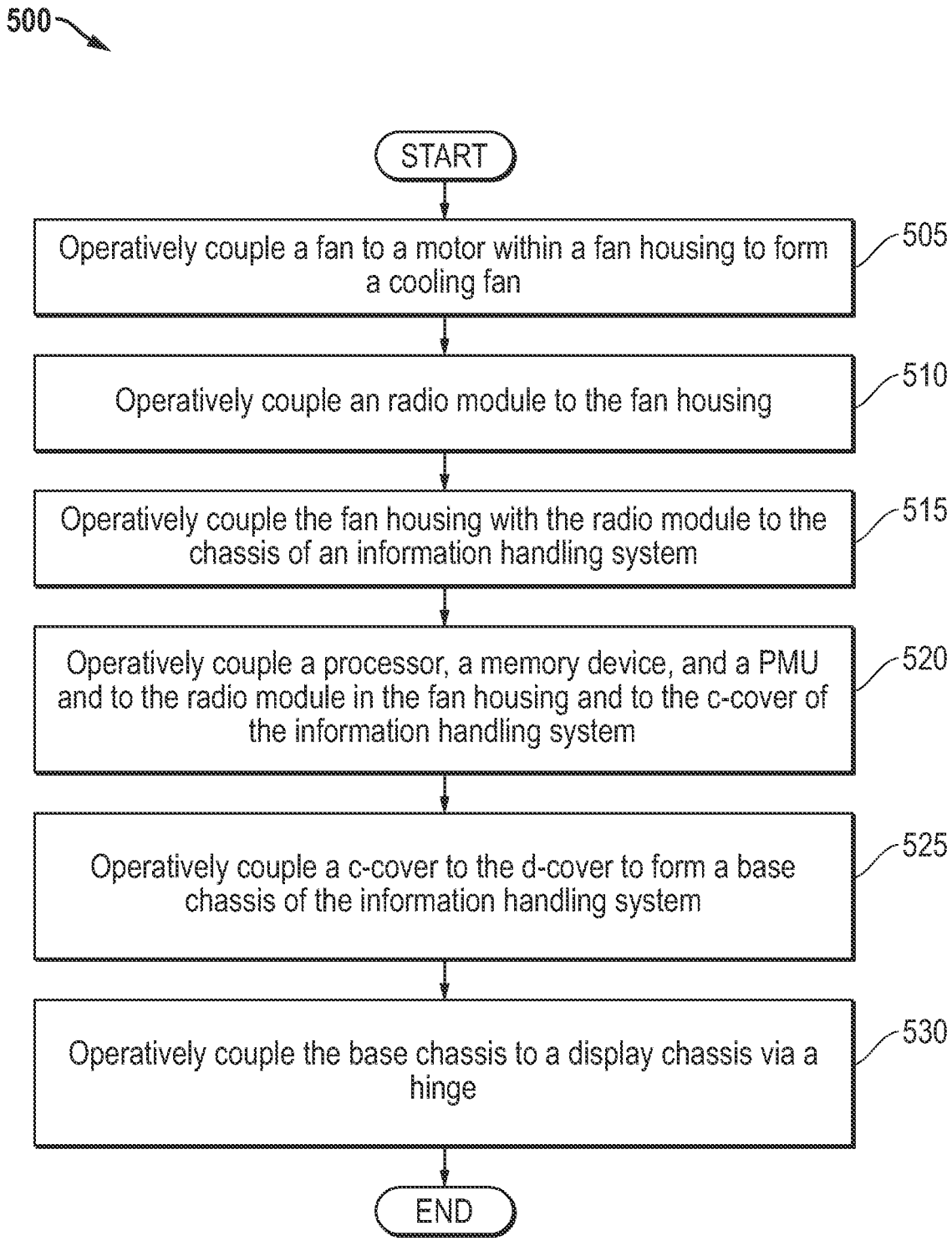
FIG. 5 is a flow diagram illustrating a method of manufacturing an information handling system with a 5G radio module in thermal contact with a fan housing according to an embodiment of the present disclosure.

FIG. 5 is a flow diagram illustrating a method 500 of manufacturing an information handling system with a radio module according to an embodiment of the present disclosure. The method 500 may include operatively coupling a fan to a motor within a fan base of a fan housing to form a cooling fan at block 505. The motor, in an example, may include a brushless motor that may fit inside the fan housing along with the fan including an axle and a plurality of blades configured to spin on an axis. A fan connector may also be included to operatively couple the fan to a power source and processing device and drivers to control the operation of the fan.

The method 500 may also include, at block 510, operatively coupling a radio module to the fan housing. As described herein, the radio module may be any radio module that receives digital data from the processor or other processing device such as the antenna controller and converts that digital data into RF signals used to transmit that data wirelessly via the antenna(s) associated with the radio module. As describe herein, heat is created when the processing device or transmitter of the radio module is transmitting this data or executing other processing tasks. It is this heat created during operation of the radio module that the cooling fan along with the fan housing and fan (among other devices) described herein are used to dissipate an amount of heat away from the radio module.

In one embodiment where the radio module is placed within the fan base of the fan housing, one or more surfaces of the radio module may be operatively coupled to an interior surface of a wall of the fan housing. As described herein, operatively coupling of one or more surfaces of the radio module to a wall allows heat to be drawn away from the radio module via conductive heating. For example, a fan cover may be placed on the fan base and may thermally couple to the top surface of the radio module within the fan housing in one embodiment. A thermal pad, thermal conductive adherent, or other thermally conductive layer may be placed between the fan cover and radio module to assist in thermal coupling in some embodiments. Additionally, where not than all surfaces of the radio module are in thermal contact with the interior surfaces of the fan housing, the radio module may also be cooled via convective cooling. Here, any exposed surface of the radio module may have an airflow passed across it via operation of the fan to cool these surfaces and the antenna controller via convective cooling. In some embodiments, the top of the radio module or sides may be cooled via airflow from the fan.

In another embodiment, where the radio module is operatively coupled to the fan housing via a fan housing extension and at least one of the surfaces of the radio module may be operatively coupled to the fan housing extension. The fan housing extension may be made of a heat conductive material that extends away from an outside surface of the fan housing such as from a fan base or fan cover of the fan housing to a location within the chassis of the information handling system where the radio module is placed. In an embodiment, the fan base of the fan housing may include a fan housing extension that is thermally coupled to the radio module when the fan base is installed in the information handling system chassis. In another embodiment, the fan housing extension extends form the fan cover and is thermally coupled to the radio module surface upon installation of the fan cover or the fan housing. Thermal coupling of the fan housing extension may be via a thermal pad, thermal adhesive, or other thermally conductive layer that is placed between the radio module on the fan housing extension in some embodiments. During operation of the radio module and as heat is produced by the radio module, heat may be drawn away from the radio module via the conductive cooling properties of the fan housing extension. As heat is conducted into the fan housing extension, the heat or some of the heat may be conducted into the fan housing. This heat may then be dissipated out of the chassis of the information handling system via operation of the fan via convective cooling.

The method 500 may include, at block 515, with operatively coupling the fan housing with the radio module to the chassis of an information handling system. The fan housing and radio module may be operatively coupled to the chassis of the information handling system via the use of any fastening device or fastening process. In an embodiment, the fan housing is placed such that an airflow exit of the fan housing opens up to an array of fins and/or heat pipe. The airflow created by the fan may exit the airflow exit and cool the array of fins and/or heat pipe. In an embodiment, the placement of the fan housing and the radio module may be such that the radio module is at a location where RF transmissions may be made without degradation to the RF signal produced by the radio module and transceived at the associated antenna(s).

The method 500 may include operatively coupling a processor, a memory device, and a PMU to the fan housing and the chassis of the information handling system. The radio module may be operatively coupled to the processor in order to receive and transmit data to and from the radio module during operation. The radio module may be operatively coupled to the PMU in order to receive power at the radio module for operations of processes as described herein. A memory device such as a main memory or static memory may be operatively coupled to the radio module, antenna controller, or processor to store processing instructions.

In example embodiments described herein, a form factor case of the information handling system may include an a-cover, a b-cover, a c-cover, and a d-cover as described herein. The method 500 includes, at block 525, operatively coupling a c-cover to a d-cover with the fan, fan housing, radio module, processor, memory, PMU and other components to form a base chassis of the information handling system. By coupling the c-cover to the d-cover, the base portion of the information handling system has now encased the components of the information handling system such as the radio module, the fan housing, the fan, the processor or CPU, data storage devices, other radio modules, a battery, speakers and other devices such as the I/O devices described herein.

At block 530, the method 500 further includes coupling the base chassis to a display chassis via a hinge. As described herein, the information handling system may be a laptop-type information handling system. In this example, embodiment, the laptop-type information handling system may include a base portion with a display portion, with an a-cover and a b-cover, operatively coupled to the base portion via a hinge mechanism. This may allow a user to view the video display device of the display portion while providing input to the information handling system via, for example, the haptic touchpad described herein. At this point the method 500 may end.

The blocks of the flow diagrams of FIG. 5 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system with a cooling system, comprising:
   a processor;
   a memory;
   a power management unit (PMU) operatively coupled to the processor;
   a cooling fan operatively coupled to the processor to draw air into and direct the air out of a base chassis of the information handling system, the cooling fan including a fan housing;
   a radio module in thermal conductive contact to the fan housing to be cooled by conduction from the radio module to the fan housing and the fan housing cooled by operation of the cooling fan via convective cooling, wherein the radio module is placed within the fan housing and contacts a first surface of the fan housing to cool the radio module via the conductive cooling; and
   an air gap is formed between the radio module and a second surface of the fan housing configured to pass the air over a portion of the radio module moved by the cooling fan to cool the radio module via said convective cooling.

2. The information handling system of claim 1, wherein the radio module is placed within the fan housing and is thermally coupled to the first surface that is a bottom surface of the fan housing and the second surface is a side surface of the fan housing.

3. The information handling system of claim 1, wherein the radio module thermally contacts the first surface of the fan housing that is a top surface of the fan housing to dissipate heat from the radio module via the conductive cooling.

4. The information handling system of claim 1, further comprising:
   a thermal pad in thermal conductive contact between the radio module and the first surface of the fan housing.

5. The information handling system of claim 1 further comprising:
   a fan housing extension of the fan housing in thermal conductive contact with the radio module and, via conductive cooling, transmit heat to the fan housing for the cooling fan to dissipate the heat, via said convective cooling of the fan housing, out of the base chassis of the information handling system.

6. The information handling system of claim 1, wherein the cooling fan is part of the cooling system, the cooling system further comprising an array of fins operatively coupled to the fan housing at an airflow exit formed along a wall of the fan housing to dissipate heat from the fan housing.

7. The information handling system of claim 1, wherein the fan housing further comprises an air inlet surface to draw the air into the fan housing via a vent in the base chassis of the information handling system.

8. The information handling system of claim 1, further comprising:
a via in the fan housing to accommodate a radio module connector to the radio module within the fan housing.

9. An information handling system with a cooling system, comprising:
a processor;
a memory;
a power management unit (PMU) operatively coupled to the processor;
a cooling fan operatively coupled to the processor to draw air into and direct the air out of a chassis of the information handling system, the cooling fan including a fan housing;
a radio module in thermal conductive contact to the fan housing inside the fan housing, where the radio module is cooled by conductive cooling to the fan housing and by operation of the cooling fan via convective cooling from airflow generated by the cooling fan, wherein the radio module is configured to be in thermal conductive contact with a first surface of the fan housing to cool the radio module via said conductive cooling; and
an air gap is formed between the radio module and a second surface of the fan housing allowing the air to be blown over a portion of the radio module by the cooling fan to cool the radio module via said convective cooling.

10. The information handling system of claim 9, wherein the radio module is in thermal conductive contact to the first surface of the fan housing that is a bottom surface or a top surface of the fan housing to dissipate heat from the radio module via said conductive cooling.

11. The information handling system of claim 9 further comprising:
a thermal pad in thermal conductive contact between a surface of the radio module and the first surface of the fan housing.

12. The information handling system of claim 9 wherein the cooling fan is part of the cooling system of the information handling system, the cooling system further comprising an array of fins operatively coupled to the fan housing at an airflow exit formed along a wall of the fan housing to dissipate heat from the fan housing.

13. The information handling system of claim 9 further comprising:
an air inlet in the fan housing to draw the air into the fan housing along an axis of the cooling fan from a bottom of the chassis of the information handling system to cool the fan housing and the radio module.

14. The information handling system of claim 9, wherein:
the radio module is configured to be in thermal conductive contact with the first surface of the fan housing and the second surface of the fan housing is a side surface of the fan housing.

15. The information handling system of claim 9, further comprising:
a heat pipe placed at an airflow exit formed along a wall of the fan housing, the heat pipe operatively coupled to a portion of the fan housing to dissipate heat received at the heat pipe from the fan housing via said convective cooling by the cooling fan.

16. An information handling system with a cooling system, comprising:
a processor;
a memory;
a power management unit (PMU) operatively coupled to the processor;
a cooling fan operatively coupled to the processor to draw air into and direct the air out of a chassis of the information handling system, the cooling fan including a fan housing;
a radio module in thermal conductive contact with the fan housing via a fan housing extension configured to extend from a first surface of the fan housing that includes thermally conductive material extending from the first surface of the fan housing, where the fan housing extension extends beyond a side wall enclosing the cooling fan inside the fan housing, where the fan housing is cooled by operation of the cooling fan; and
the fan housing extension is in thermal contact to the radio module disposed outside the side wall of the fan housing.

17. The information handling system of claim 16, wherein the radio module is in thermal conductive contact with a first surface of the fan housing extension to dissipate heat from the radio module via conductive cooling.

18. The information handling system of claim 16, further comprising:
a thermal pad in thermal conductive contact between the radio module and the fan housing extension.

19. The information handling system of claim 16, wherein the fan housing further comprises an air outlet vent to direct the air out of the fan housing and out of an air outlet vent formed in the chassis of the information handling system.

20. The information handling system of claim 16, wherein the cooling fan is part of the cooling system, the cooling system further comprising an array of fins operatively coupled to the fan housing at an airflow exit formed along a wall of the fan housing to dissipate heat from the fan housing.

* * * * *